United States Patent
Wang et al.

(10) Patent No.: US 11,094,481 B2
(45) Date of Patent: Aug. 17, 2021

(54) KEYSWITCH CAPABLE OF IDENTIFYING KEYCAP CHANGE

(71) Applicant: PixArt Imaging Inc., Hsin-Chu (TW)

(72) Inventors: Tsung-Fa Wang, Hsin-Chu (TW); Yen-Min Chang, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 94 days.

(21) Appl. No.: 16/372,385

(22) Filed: Apr. 1, 2019

(65) Prior Publication Data
US 2019/0228931 A1    Jul. 25, 2019

Related U.S. Application Data

(63) Continuation-in-part of application No. 15/491,990, filed on Apr. 20, 2017, now Pat. No. 10,297,405.

(30) Foreign Application Priority Data

Nov. 15, 2016  (TW) .................................. 105137167

(51) Int. Cl.
*H01H 13/7073* (2006.01)
*H03K 17/968* (2006.01)
(Continued)

(52) U.S. Cl.
CPC ....... *H01H 13/7073* (2013.01); *H03K 17/968* (2013.01); *G06F 1/1662* (2013.01); *H03K 17/98* (2013.01)

(58) Field of Classification Search
CPC . G06F 1/1662; G06F 3/00; G06F 3/02; G06F 3/0202; H03K 17/96; H03K 17/968; H03K 17/98; H01H 13/7073; H01H 2219/054; H01H 2219/06; H01H 2219/064; H01H 2219/00; H01H 2219/014; H01H 2219/018; H01H 2219/026; H01H 2219/036; H01H 2219/037; H01H 2219/039; H01H 2003/15; H01H 2215/044; H01H 13/00; H01H 13/14; H01H 13/26;
(Continued)

(56) References Cited

U.S. PATENT DOCUMENTS

4,475,142 A     10/1984   Sparks
5,408,060 A *   4/1995    Muurinen ................ G05G 1/02
                                                         200/310
(Continued)

*Primary Examiner* — Anthony R Jimenez
(74) *Attorney, Agent, or Firm* — Winston Hsu (57) ABSTRACT

A keyswitch capable of identifying keycap change includes a substrate, a keycap, a resilient component, an optical detection module and a processor. The keycap is disposed above the substrate and includes a reflective element. The optical detection module is disposed on the substrate and adapted to receive an optical signal reflected from the reflective element. The processor is disposed on the substrate and electrically connected to the optical detection module. The processor is adapted to analyze the optical signal for acquiring a type and a movement of the keycap. The keyswitch further includes a supporting component and a membrane. An end of the supporting component is connected to the keycap, and the other end of the supporting component is connected to the substrate. The membrane has light penetrating property and is disposed above the optical detection module.

16 Claims, 6 Drawing Sheets

(51) Int. Cl.
 *G06F 1/16* (2006.01)
 *H03K 17/98* (2006.01)
(58) Field of Classification Search
 CPC ........ H01H 13/28; H01H 13/50; H01H 13/70;
 H01H 3/12
 USPC ........................................................ 200/5 A
 See application file for complete search history.

(56) References Cited

U.S. PATENT DOCUMENTS

2006/0152494 A1* 7/2006 Liess .................... G06F 1/1662
 345/169
2016/0306437 A1* 10/2016 Zhang ................... G06F 1/1662

* cited by examiner

KEYSWITCH CAPABLE OF IDENTIFYING KEYCAP CHANGE

CROSS REFERENCE TO RELATED APPLICATIONS

This application is a continuation in part of U.S. application Ser. No. 15/491,990, filed 2017 Apr. 20.

BACKGROUND OF THE INVENTION

1. Field of the Invention

The present invention relates to a keyswitch, and more particularly, to a keyswitch capable of identifying keycap change.

2. Description of the Prior Art

Figure 6:
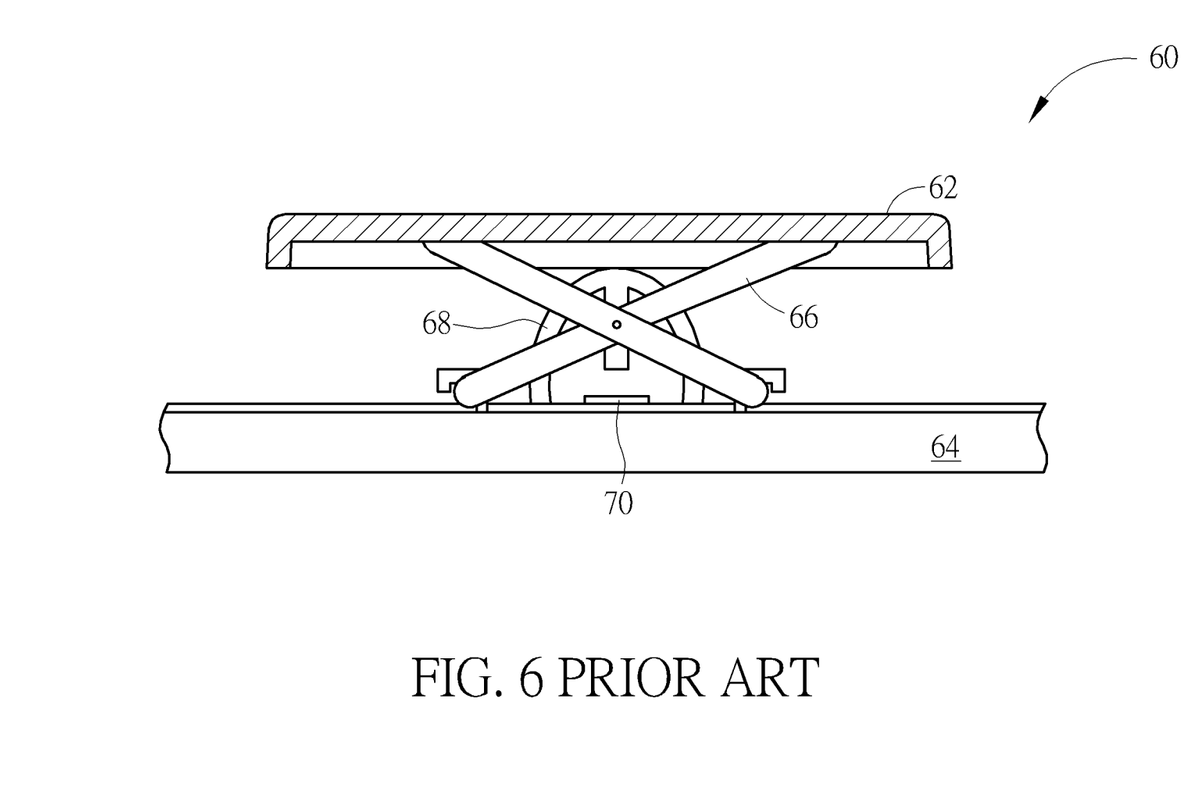
FIG. 6 is a structural diagram of a mechanical keyswitch in prior art.

Please refer to FIG. 6. FIG. 6 is a structural diagram of a mechanical keyswitch 60 in prior art. A keycap 62 of the conventional mechanical keyswitch 60 can be moved relative to a substrate 64 via a lifting unit 66. While the keycap 62 is pressed to move downwardly along the supporter 64, a resilient component 68 is resiliently deformed to contact a switch 70 disposed on the substrate 64 for forming a conductive channel and outputting an actuating signal, and the actuating signal is analyzed to acquire a control command about the pressed mechanical keyswitch 60. However, the conventional mechanical keyswitch 60 utilizes a pillar located under the keycap 62 to contact the switch 70 when the keycap 62 is pressed down, the user feel one-stage hand feeling within an operational stroke of the conventional mechanical keyswitch, and design of a keyswitch having multistage controlling function is an important issue in the related mechanical design industry.

SUMMARY OF THE INVENTION

The present invention provides a keyswitch capable of identifying keycap change for solving above drawbacks.

According to the claimed invention, a keyswitch capable of identifying keycap change includes a substrate, a keycap, a resilient component, an optical detection module and a processor. The keycap is disposed above the substrate and includes a reflective element. The optical detection module is disposed on the substrate and adapted to receive an optical signal reflected from the reflective element. The processor is disposed on the substrate and electrically connected to the optical detection module. The processor is adapted to analyze the optical signal for acquiring a type and a movement of the keycap. The keyswitch further includes a supporting component and a membrane. An end of the supporting component is connected to the keycap, and the other end of the supporting component is connected to the substrate. The membrane has light penetrating property and is disposed above the optical detection module.

According to the claimed invention, the optical detection module comprises an optical emitter and an optical receiver, and the optical receiver receives the optical signal emitted from the optical emitter via the reflective element. The processor analyzes at least one of intensity of the optical signal and position of the optical signal projected onto the optical detection to determine a reflection coefficient of the reflective element and accordingly to acquire the type of the keycap. The optical detection module provides a linear optical detection function, and the processor analyzes intensity variation of the optical signal to determine the movement of the keycap.

The keyswitch of the present invention can utilize the optical detection module to detect whether the keycap is pressed, the pressing depth of the pressed keyswitch, and change of the keycap or its reflective element. The optical detection module can analyze the intensity of the optical signal reflected from the reflective element on the keycap; the reflective element is identified as having the low reflection coefficient if the intensity is within the low gray level range, and the reflective element is identified as having the high reflection coefficient if the intensity is within the high gray level range. The user can exchange the reflective element (or the keycap with the reflective element) to vary hand feeling of the keyswitch; therefore, the processor can identify the reflection coefficient (and the related reflective element and keycap) for ascertaining how to switch and actuate the operation modes of the keyswitch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
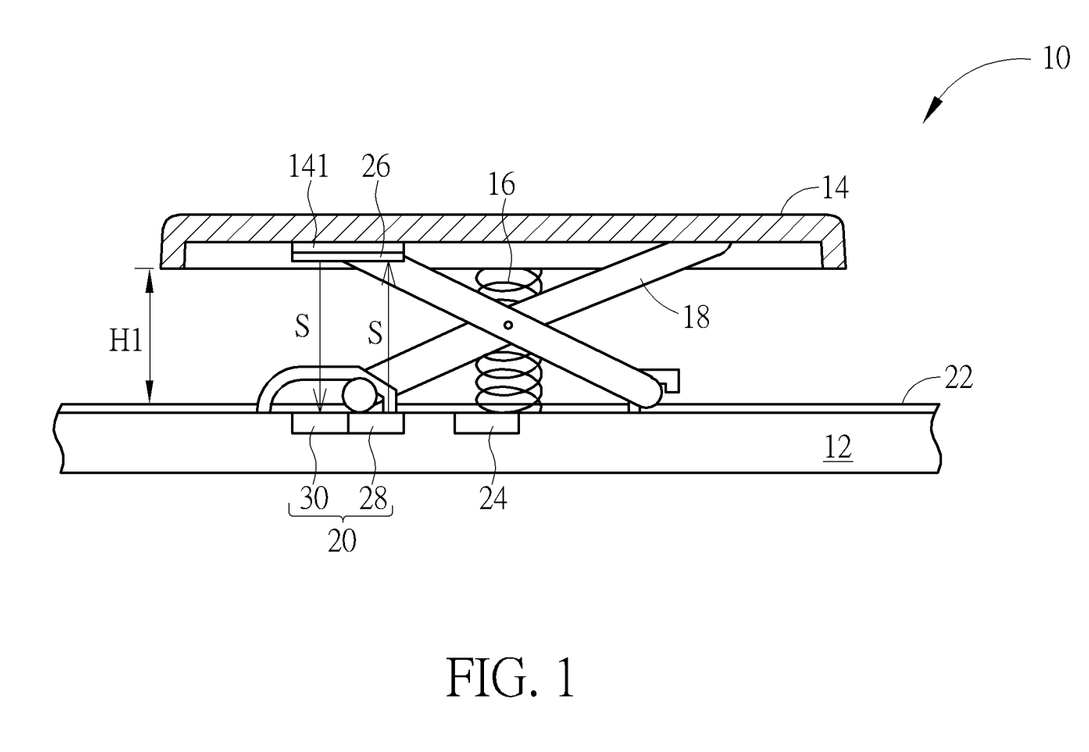
FIG. 1 is a diagram of a keyswitch according to an embodiment of the present invention.

Please refer to FIG. 1. FIG. 1 is a diagram of a keyswitch 10 according to an embodiment of the present invention. The keyswitch 10 can include a substrate 12, a keycap 14, a resilient component 16, a supporting component 18, an optical detection module 20, a membrane 22 and a processor 24. The keycap 14 can have a reflective element 26 disposed on a base 141 of the keycap 14. The base 141 can be an inner surface of the keycap 14. The reflective element 26 can be disposed on the base 141 by coating or adhesive. The resilient component 16 can be disposed between the substrate 12 and the keycap 14. A resilient recovering force of the resilient component 16 is used to move the keycap 14 back to an initial position when an external force applied to the keycap 14 is removed. Two ends of the supporting component 18 can be respectively connected to the substrate 12 and the keycap 14 for holding and positioning the keycap 14.

The optical detection module 20 can be disposed on the substrate 12 and include an optical emitter 28 and an optical receiver 30. The optical emitter 28 can output an optical signal S toward the keycap 14. The optical receiver 30 can receive the optical signal S reflected from the reflective element 26 of the keycap 14. The membrane 22 is an optional element. The membrane 22 can be disposed on the substrate 12 and adapted to cover the optical detection module 20 for protection. The membrane 22 can have light penetrating property, and therefore the optical signal S can penetrate through the membrane 22 to project onto the reflective element 26 and be received by the optical detection module 20. The processor 24 can be disposed on the substrate 12 and electrically connected to the optical detection module 20. The processor 24 can analyze at least one of intensity of the optical signal S and position of the optical signal S projected onto the optical detection 20 to acquire a type and a movement of the keycap 14.

The type of the keycap 14 can be acquired to determine an operation mode of the keyswitch 10. The movement of the keycap 14 can be acquired to determine whether the keyswitch 10 is pressed and a pressing depth of the pressed keyswitch 10. In this embodiment, the keycap 14 with the reflective element 26 is replaced by another one, so the processor 24 analyzes the optical signal S to acquire the type and the movement of the keycap 14. If the keycap 14 is undetachable but the reflective element 26 can be replaced, the processor 24 can analyze the optical signal S to acquire a type of the reflective element 26 and the movement of the keycap 14.

Figure 2:
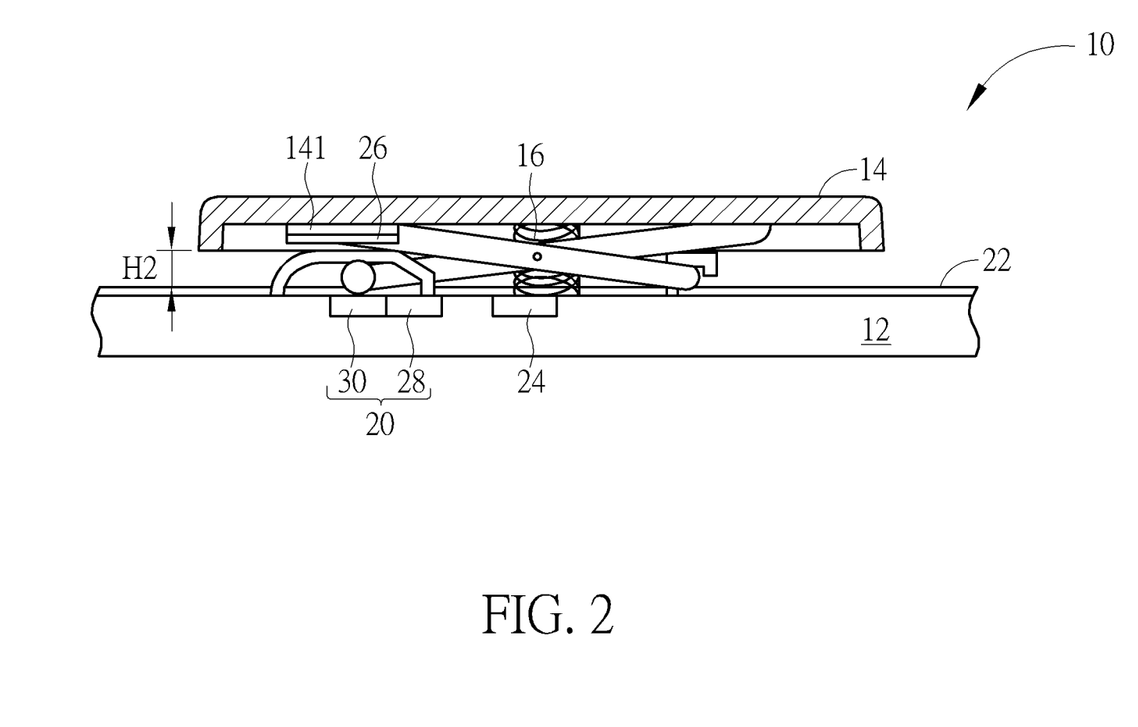
FIG. 2 and FIG. 3 are diagrams of the keyswitch in other operation modes according to the embodiment of the present invention.
Figure 3:
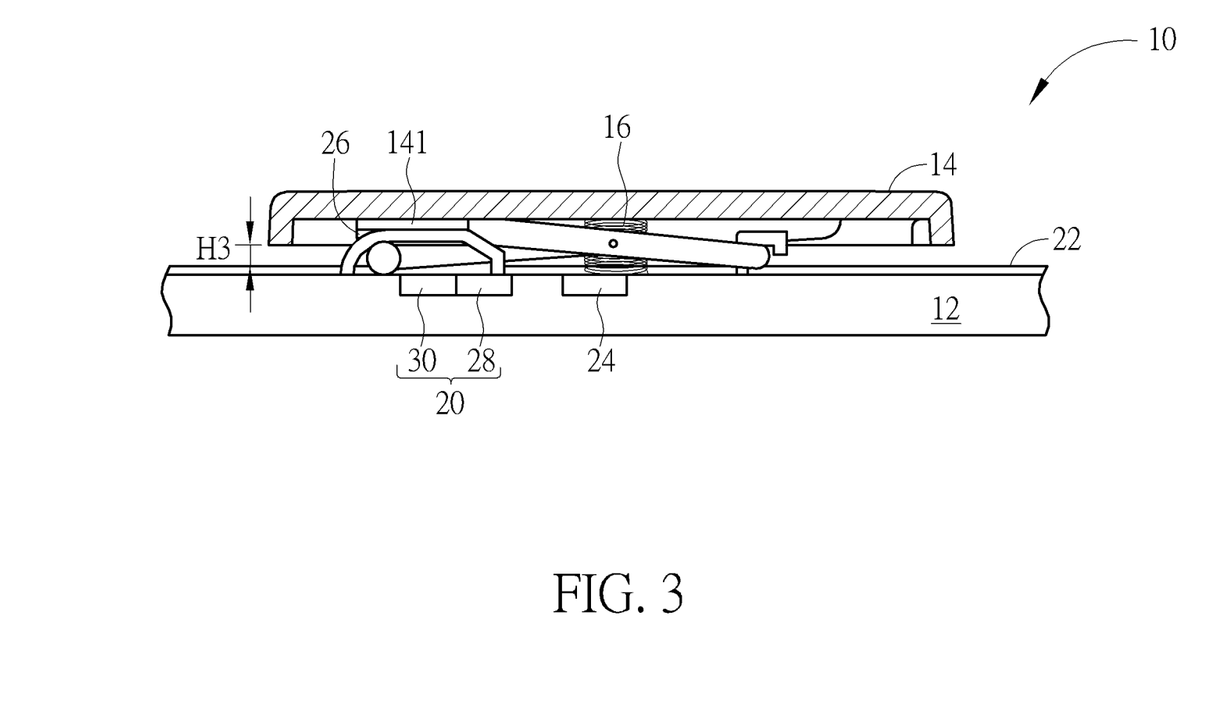

In the embodiment, the optical detection module 20 can provide a linear optical detection function. The optical detection module 20 not only can detect whether the keycap 14 is pressed, but also compute a moving distance of the keycap 14 for representing specific control commands. Please refer to FIG. 1 to FIG. 3. FIG. 2 and FIG. 3 are diagrams of the keyswitch 10 in other operation modes according to the embodiment of the present invention. In the operation mode shown in FIG. 1, the keycap 14 is in an initial mode, and a distance H1 can be set between the keycap 14 and the substrate 12; the keycap 14 is located at a high position, which means the keyswitch 10 is not actuated. In the operation mode shown in FIG. 2, the keycap 14 is pressed and moved to a middle position; therefore, a distance H2 can be set between the keycap 14 and the substrate 12, and the processor 24 may output a first control command. In the operation mode shown in FIG. 3, the keycap 14 is pressed to locate at a low position, then a distance H3 can be set between the keycap 14 and the substrate 12, and the processor 24 may output a second control command different from the first control command. The processor 24 analyzes intensity variation of the optical signal S to determine the keycap 14 is moved to the high position, the middle position or the low position.

A user can replace the reflective element 26 (or the keycap 14 with the reflective element 26) by another to switch on or off the linear optical detection function of the optical detection module 20. The processor 24 can analyze intensity of the optical signal S to determine that the optical signal S belongs to a first condition or a second condition, and then determine the type of the keycap 14 for switching operation modes of the keyswitch 10. The operation modes may be represented as a multi-stage control mode and a single-stage control mode. The first condition may be an intensity range from a gray level 20 to a gray level 30. The second condition may be an intensity range from a gray level 200 to a gray level 230. An amount and a feature of the conditions are not limited to the above-mentioned embodiment, which depend on actual demand. For example, the optical signal S may belong to the first condition, the second condition or a third condition alternatively, and the third condition can be an intensity range from a gray level 100 to a gray level 150.

Replacement of the reflective element 26 can be executed by several manners. In a first situation, the reflective element 26 is detachably disposed on the base 141 of the keycap 14, so that the reflective element 26 can be detached and replaced by another reflective element with different reflection coefficient. In a second situation, the keycap 14 is detachably assembled with the resilient component, so the keycap 14 with the reflective element 26 can be detached and replaced by another keycap with another reflective element having different reflection coefficient. In a third situation, the keycap 14 and the resilient component 16 (or the supporting component 18) can be integrated as a combined set detachably disposed on the substrate 12, thus the combined set can be replaced by another combined set which has the keycap and the resilient component.

According to the foresaid embodiments, the processor 24 can analyze the intensity of the optical signal S to determine the reflection coefficient of the reflective element 26, and then switch the keyswitch 10 to the multi-stage control mode or the single-stage control mode. When the processor 24 analyzes the optical signal S belongs to the first condition, the intensity of the reflected optical signal S is weak, so that the reflective element 26 on the keycap 14 can be represented as having a low reflection coefficient, and the keyswitch 10 can be switched to one of the multi-stage control mode and the single-stage control mode; when the processor 24 analyzes the optical signal S belongs to the second condition, the intensity of the reflected optical signal S is bright, so the reflective element 26 on the keycap 14 can be represented as having a high reflection coefficient, and the keyswitch 10 can be switched to the other control mode.

Figure 4:
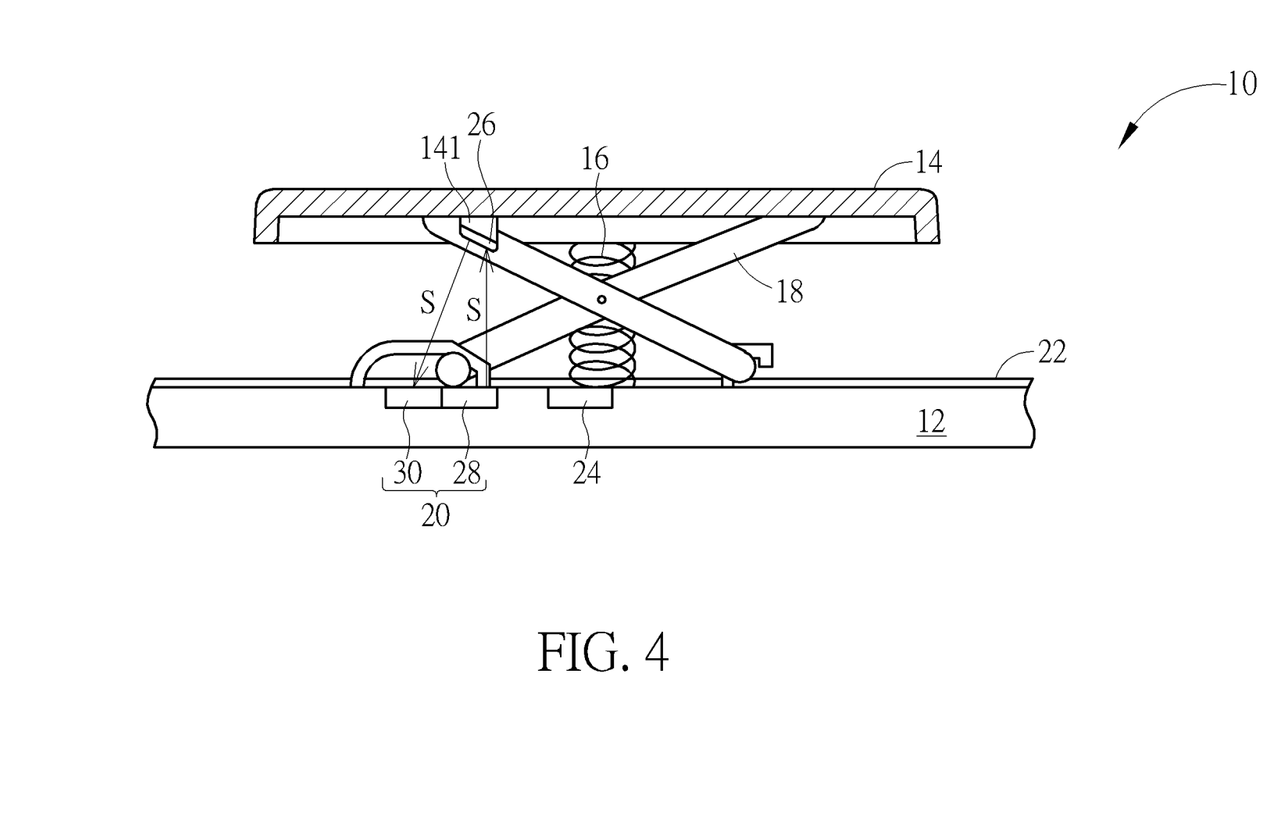
FIG. 4 is a diagram of the keyswitch according to another embodiment of the present invention.

In another possible embodiment, an inclined angle of the reflective element 26 relative to the base 141 can be identified for switching the operation modes. Please refer to FIG. 1 and FIG. 4. FIG. 4 is a diagram of the keyswitch 10 according to another embodiment of the present invention. In the embodiment shown in FIG. 1, the reflective element 26 having the first reflection coefficient is disposed on the base 141 in parallel; in the embodiment shown in FIG. 4, the reflective element 26 having the second reflection coefficient can be inclined relative to the base 141. The processor 24 can analyze projected position of the optical signal S onto the optical detection module 20 to identify the reflection coefficient of the reflective element 26. For example, when the processor 24 analyzes the projected position of the optical signal S is close to the optical emitter 28, the reflective element 26 can be represented as having the first reflection coefficient; when the processor 24 analyzes the projected position of the optical signal S is distant from the optical emitter 28, the reflective element 26 can be represented as having the second reflection coefficient. As the reflection coefficient is identified, the types of the reflective element 26 or the keycap 14 can be determined and thus the keyswitch 10 can be switched to the multi-stage control mode or the single-stage control mode accordingly.

In the foresaid embodiment, the reflective element 26 is a flat surface facing the optical detection module 20, and therefore the optical signal S cannot be diverged or converged. In other possible embodiment, the reflective element 26 may be set as an arc surface facing the optical detection module 20, and the processor 24 can analyze divergence or convergence of the optical signal S for determining the reflection coefficient of the reflective element 26 and the type of the keycap 14.

Figure 5:
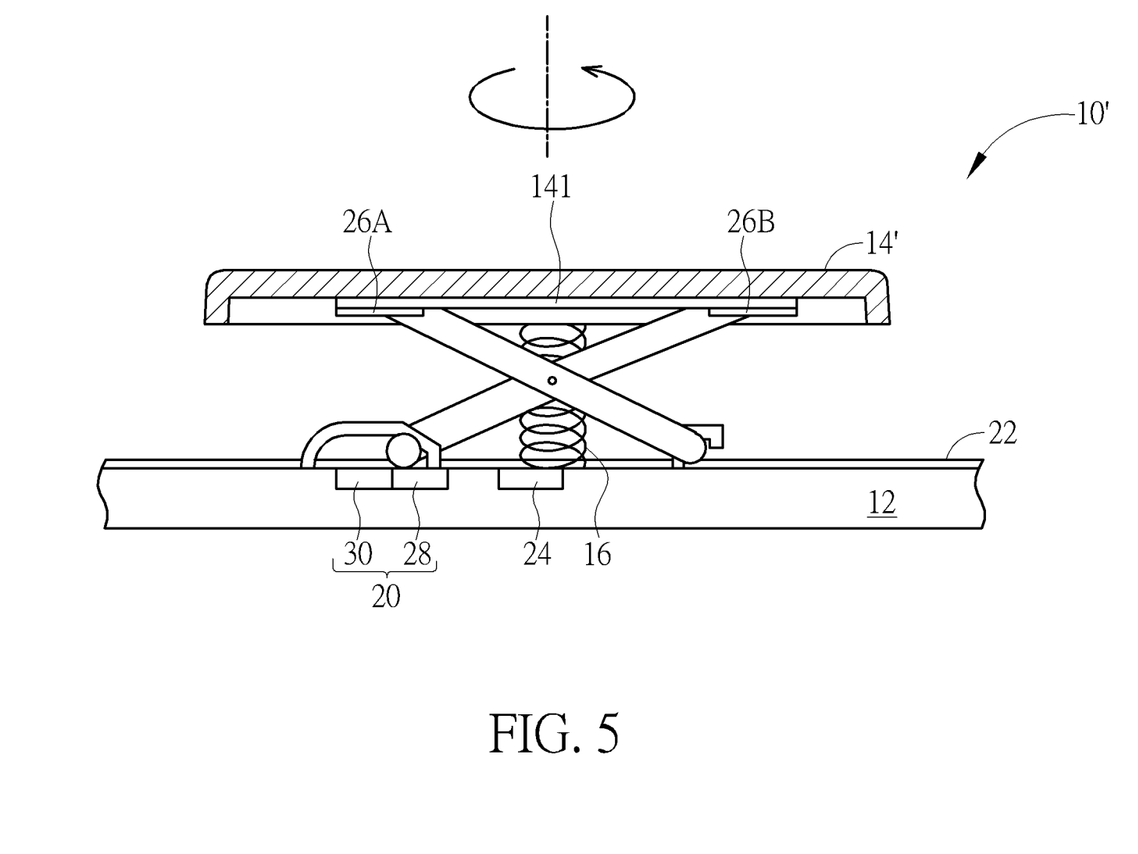
FIG. 5 is a diagram of a keyswitch according to another embodiment of the present invention.

Please refer to FIG. 5. FIG. 5 is a diagram of a keyswitch 10' according to another embodiment of the present invention. In this embodiment, elements having the same numeral have the same structures and functions, and a detailed description can be omitted herein for simplicity. Difference between the two embodiments is that the keycap 14' of the keyswitch 10' can include the base 141, a first reflective element 26A and a second reflective element 26B. The first reflective element 26A and the second reflective element 26B can be disposed on the base 141 and respectively formed by material having different reflection coefficients. The first reflective element 26A and the second reflective element 26B may be put on the base 141 at the same time, or can be alternatively put on the base 141.

In one situation, the first reflective element 26A can be located above the optical detection module 20, so that the processor 24 can trigger a related control mode of the keyswitch 10; for example, the multi-stage control mode can be triggered when the first reflective element 26A has the low reflection coefficient. If the user wants to switch the operation mode of the keyswitch 10, positions of the first reflective element 26A and the second reflective element 26B can be exchanged, then the processor 24 can switch the keyswitch 10 to the other operation mode, such as the single-stage control mode because the second reflective element 26B located above the optical detection module 20 has the high reflection coefficient. The first reflective element 26A and the second reflective element 26B can exchange its position if being put on the base 141 at the same time. If the first reflective element 26A and the second reflective element 26B are alternatively put on the base 141, one of the first reflective element 26A and the second reflective element 26B may be disposed on the base 141 above the optical detection module 20, and the other is detached.

In another situation, the first reflective element 26A and the second reflective element 26B are both put on the base 141, and the keycap 14' can be movably assembled with the substrate 12; for example, the keycap 14' may be rotatable or the combined set including the keycap 14' and the resilient component 16 (or the supporting component 18) is rotatable. Therefore, the user can rotate the keycap 14' to stay the first reflective element 26A or the second reflective element 26B at a place above the optical detection module 20, and then the processor 24 can analyze the optical signal to determine the optical detection module 20 faces the first reflective element 26A or the second reflective element 26B because of as effect upon the reflection coefficient, so as to switch the keyswitch 10 operated in the multi-stage control mode or the single-stage control mode accordingly.

The keyswitch of the present invention can utilize the optical detection module to detect whether the keycap is pressed, the pressing depth of the pressed keyswitch, and change of the keycap or its reflective element. The optical detection module can analyze the intensity of the optical signal reflected from the reflective element on the keycap; the reflective element is identified as having the low reflection coefficient if the intensity is within the low gray level range, and the reflective element is identified as having the high reflection coefficient if the intensity is within the high gray level range. The user can exchange the reflective element (or the keycap with the reflective element) to vary hand feeling of the keyswitch; therefore, the processor can identify the reflection coefficient (and the related reflective element and keycap) for ascertaining how to switch and actuate the operation modes of the keyswitch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch with a keycap change identifying function and at least two operation modes, comprising
    a substrate;
    a keycap disposed above the substrate, the keycap comprising a reflective element with a specific reflection coefficient according to a type of the keycap, wherein the type is identified to determine an operation mode of the keyswitch;
    a resilient component disposed between the substrate and the keycap;
    an optical detection module disposed on the substrate, the optical detection module receiving an optical signal reflected from the reflective element; and
    a processor disposed on the substrate and electrically connected to the optical detection module, the processor analyzing an intensity range of the optical signal for acquiring the type of the keycap.

2. The keyswitch of claim 1, wherein the optical detection module comprises an optical emitter and an optical receiver, and the optical receiver receives the optical signal emitted from the optical emitter via the reflective element.

3. The keyswitch of claim 1, further comprising:
    a supporting component, an end of the supporting component being connected to the keycap, and another end of the supporting component being connected to the substrate.

4. The keyswitch of claim 1, further comprising:
    a membrane having a light penetrating property and disposed above the optical detection module.

5. The keyswitch of claim 1, wherein the processor analyzes an intensity of the optical signal to determine a reflection coefficient of the reflective element and accordingly to acquire the type of the keycap.

6. The keyswitch of claim 1, wherein the processor further analyzes a position of the optical signal projected onto the optical detection module to determine a reflection coefficient and accordingly to acquire the type of the keycap.

7. The keyswitch of claim 1, wherein the reflective element has a flat surface or an arc surface facing the optical detection module.

8. The keyswitch of claim 1, wherein the reflective element is detachably disposed on a base of the keycap.

9. The keyswitch of claim 8, wherein the reflective element is inclined relative to the base.

10. The keyswitch of claim 8, wherein the reflective element is disposed on the base by coating or adhesive.

11. The keyswitch of claim 1, wherein the optical detection module provides a linear optical detection function, and the processor analyzes an intensity variation of the optical signal to determine a movement of the keycap.

12. The keyswitch of claim 11, wherein the keycap is detachably assembled with the resilient component, the processor analyzes the optical signal to determine whether the keycap is replaced and whether to switch modes of the linear optical detection function.

13. The keyswitch of claim 11, wherein the keycap and the resilient component are a combined set detachably disposed on the substrate, the processor analyzes the optical signal to determine whether the combined set is replaced and whether to switch modes of the linear optical detection function.

14. The keyswitch of claim 1, wherein the keycap comprises a base, and a first reflective element and a second reflective element formed by material having different reflection coefficients and disposed on the base, and the processor analyzes the optical signal to determine whether the optical signal is reflected from the first reflective element or the second reflective element.

15. The keyswitch of claim 14, wherein the first reflective element and the second reflective element are disposed on the base alternatively.

16. The keyswitch of claim 14, wherein the keycap is movably assembled with the substrate, and the processor analyzes the optical signal to determine whether the optical detection module faces the first reflective element or the second reflective element.

* * * * *